(12) United States Patent
O'Sullivan et al.

(10) Patent No.: US 11,735,570 B2
(45) Date of Patent: Aug. 22, 2023

(54) FAN OUT PACKAGING POP MECHANICAL ATTACH METHOD

(71) Applicant: Intel Corporation, Santa Clara, CA (US)

(72) Inventors: David O'Sullivan, Ottobrunn (DE); Georg Seidemann, Landshut (DE); Richard Patten, Langquaid (DE); Bernd Waidhas, Pettendorf (DE)

(73) Assignee: Intel Corporation, Santa Clara, CA (US)

( * ) Notice: Subject to any disclaimer, the term of this patent is extended or adjusted under 35 U.S.C. 154(b) by 916 days.

(21) Appl. No.: 15/945,648

(22) Filed: Apr. 4, 2018

(65) Prior Publication Data

US 2019/0312016 A1   Oct. 10, 2019

(51) Int. Cl.
  *H01L 25/10*   (2006.01)
  *H01L 23/31*   (2006.01)
  (Continued)

(52) U.S. Cl.
  CPC .......... *H01L 25/105* (2013.01); *H01L 21/486* (2013.01); *H01L 21/4853* (2013.01);
  (Continued)

(58) Field of Classification Search
  CPC ....... H01L 25/105; H01L 24/96; H01L 24/20; H01L 2924/15311; H01L 2924/15313;
  (Continued)

(56) References Cited

U.S. PATENT DOCUMENTS 6,828,665 B2 * 12/2004 Pu ........................ H01L 23/5385
                                                    257/E21.503
7,138,709 B2 * 11/2006 Kumamoto ......... H01L 23/3128
                                                    257/686
(Continued)

FOREIGN PATENT DOCUMENTS

DE   102017123326 A1 *  9/2018  ......... H01L 21/6835
EP       3073527 A1 *   9/2016  ......... H01L 23/5389
(Continued)

OTHER PUBLICATIONS

Machine translation, Taiwan Intellectual Property Office (TIPO) Office Action dated Sep. 7, 2022, translation date: Jan. 26, 2023, all pages. (Year: 2023).*

(Continued)

*Primary Examiner* — Victoria K. Hall
(74) *Attorney, Agent, or Firm* — Schwabe, Williamson & Wyatt, P.C.

(57) ABSTRACT

Embodiments include semiconductor packages and a method of forming the semiconductor packages. A semiconductor package includes a mold over and around a first die and a first via. The semiconductor package has a conductive pad of a first redistribution layer disposed on a top surface of the first die and/or a top surface of the mold. The semiconductor package includes a second die having a solder ball coupled to a die pad on a bottom surface of the second die, where the solder ball of the second die is coupled to the first redistribution layer. The first redistribution layer couples the second die to the first die, where the second die has a first edge and a second edge, and where the first edge is positioned within a footprint of the first die and the second edge is positioned outside the footprint of the first die.

9 Claims, 7 Drawing Sheets

(51) Int. Cl.
*H01L 23/538* (2006.01)
*H01L 23/00* (2006.01)
*H01L 21/48* (2006.01)
*H01L 21/56* (2006.01)
*H01L 25/00* (2006.01)

(52) U.S. Cl.
CPC ........ *H01L 21/565* (2013.01); *H01L 23/3114* (2013.01); *H01L 23/5384* (2013.01); *H01L 23/5386* (2013.01); *H01L 23/5389* (2013.01); *H01L 24/19* (2013.01); *H01L 24/20* (2013.01); *H01L 24/96* (2013.01); *H01L 25/50* (2013.01); *H01L 2224/214* (2013.01); *H01L 2225/1035* (2013.01); *H01L 2225/1058* (2013.01)

(58) Field of Classification Search
CPC . H01L 2224/32135; H01L 2224/02371; H01L 2224/08137; H01L 2224/04105; H01L 23/3157; H01L 2224/023–024
See application file for complete search history.

(56) References Cited

U.S. PATENT DOCUMENTS

| | | | | |
|---|---|---|---|---|
| 7,378,726 | B2* | 5/2008 | Punzalan | H01L 23/3121 257/685 |
| 7,402,901 | B2* | 7/2008 | Hatano | H01L 24/05 257/777 |
| 7,619,901 | B2* | 11/2009 | Eichelberger | H05K 3/30 361/764 |
| 7,633,765 | B1* | 12/2009 | Scanlan | H01L 23/5389 174/262 |
| 7,858,441 | B2* | 12/2010 | Lin | H01L 23/5389 438/455 |
| 7,923,295 | B2* | 4/2011 | Shim | H01L 21/6835 257/737 |
| 7,973,418 | B2 | 7/2011 | Alvarado | |
| 8,076,770 | B2* | 12/2011 | Kagaya | H01L 25/105 257/784 |
| 8,116,100 | B2* | 2/2012 | Saen | H01L 25/18 361/803 |
| 8,193,034 | B2* | 6/2012 | Pagaila | H01L 24/73 257/737 |
| 8,237,257 | B2* | 8/2012 | Yang | H01L 23/5384 257/692 |
| 8,354,297 | B2* | 1/2013 | Pagaila | H01L 21/568 438/126 |
| 8,445,323 | B2* | 5/2013 | Lin | H01L 23/5389 257/532 |
| 8,508,045 | B2* | 8/2013 | Khan | H01L 23/552 257/737 |
| 8,518,746 | B2* | 8/2013 | Pagaila | H01L 24/96 438/618 |
| 8,685,792 | B2* | 4/2014 | Chow | H01L 25/16 438/109 |
| 8,686,570 | B2* | 4/2014 | Semmelmeyer | H01L 25/0652 257/737 |
| 8,729,714 | B1* | 5/2014 | Meyer | H01L 24/82 257/777 |
| 8,742,579 | B2* | 6/2014 | Pagaila | H01L 25/105 438/458 |
| 8,884,431 | B2* | 11/2014 | Lin | H01L 23/49816 257/738 |
| 8,975,726 | B2* | 3/2015 | Chen | H01L 23/5389 257/532 |
| 9,379,074 | B2* | 6/2016 | Uzoh | H01L 25/0657 |
| 9,385,110 | B2* | 7/2016 | Yeh | H01L 24/02 |
| 9,443,797 | B2* | 9/2016 | Marimuthu | H01L 23/5389 |
| 9,461,025 | B2* | 10/2016 | Yu | H01L 25/105 |
| 9,484,227 | B1* | 11/2016 | Cheng | H01L 25/105 |
| 9,559,088 | B2* | 1/2017 | Gonzalez | H01L 24/82 |
| 9,583,456 | B2* | 2/2017 | Uzoh | H01L 24/97 |
| 9,607,967 | B1* | 3/2017 | Shih | H01L 25/0657 |
| 9,640,517 | B2* | 5/2017 | Choh | H01L 23/49517 |
| 9,773,757 | B2* | 9/2017 | Yu | H01L 24/19 |
| 9,812,402 | B2* | 11/2017 | Awujoola | H01L 25/03 |
| 9,852,969 | B2* | 12/2017 | Uzoh | H01L 24/17 |
| 9,859,245 | B1* | 1/2018 | Chen | H01L 21/561 |
| 9,972,573 | B2* | 5/2018 | Tao | H01L 25/50 |
| 9,972,609 | B2* | 5/2018 | Tao | H01L 23/3157 |
| 9,984,992 | B2* | 5/2018 | DeLaCruz | H01L 23/3121 |
| 9,985,007 | B2* | 5/2018 | Tao | H01L 23/3157 |
| 9,991,233 | B2* | 6/2018 | Tao | H01L 24/02 |
| 9,991,235 | B2* | 6/2018 | Tao | H01L 21/52 |
| 10,115,678 | B2* | 10/2018 | Awujoola | H01L 24/73 |
| 10,128,217 | B2* | 11/2018 | Ye | H01L 23/3135 |
| 10,325,877 | B2* | 6/2019 | Delacruz | H01L 23/552 |
| 10,354,976 | B2* | 7/2019 | Tao | H01L 23/5283 |
| 10,446,523 | B2* | 10/2019 | Marimuthu | H01L 24/32 |
| 10,475,774 | B2* | 11/2019 | Song | G11C 5/04 |
| 10,483,250 | B2* | 11/2019 | Nair | H01L 23/48 |
| 10,490,528 | B2* | 11/2019 | Prabhu | H01L 24/47 |
| 10,559,537 | B2* | 2/2020 | Awujoola | H01L 23/49811 |
| 10,720,401 | B2* | 7/2020 | Ting | H01L 23/5386 |
| 11,133,290 | B2* | 9/2021 | Zeng | H01L 23/49811 |
| 11,152,333 | B2* | 10/2021 | Lunde | H01L 24/17 |
| 11,177,201 | B2* | 11/2021 | Chen | H01L 24/97 |
| 11,257,793 | B2* | 2/2022 | Jang | H01L 25/0657 |
| 11,270,941 | B2* | 3/2022 | Seidemann | H01L 25/0652 |
| 11,289,456 | B2* | 3/2022 | Lee | H01L 23/3128 |
| 11,335,663 | B2* | 5/2022 | Liff | H01L 21/486 |
| 11,348,897 | B2* | 5/2022 | Elsherbini | H01L 24/14 |
| 11,417,643 | B2* | 8/2022 | Liu | H01L 24/97 |
| 11,469,206 | B2* | 10/2022 | Elsherbini | H01L 25/50 |
| 2004/0262729 | A1* | 12/2004 | Kumamoto | H01L 25/105 257/678 |
| 2005/0052830 | A1* | 3/2005 | Bauer | H01L 24/97 257/E25.011 |
| 2007/0241442 | A1* | 10/2007 | Ha | H01L 25/03 257/686 |
| 2007/0290333 | A1* | 12/2007 | Saini | G11C 5/063 257/723 |
| 2008/0042265 | A1* | 2/2008 | Merilo | H01L 24/49 257/723 |
| 2008/0150157 | A1* | 6/2008 | Nishimura | H01L 24/29 257/737 |
| 2009/0267238 | A1* | 10/2009 | Joseph | H01L 23/49833 438/109 |
| 2010/0025833 | A1* | 2/2010 | Pagaila | H01L 24/97 257/686 |
| 2011/0037169 | A1* | 2/2011 | Pagaila | H01L 24/97 257/737 |
| 2011/0049695 | A1* | 3/2011 | Shin | H01L 23/3128 257/686 |
| 2011/0068427 | A1* | 3/2011 | Paek | H01L 24/82 257/433 |
| 2011/0068444 | A1* | 3/2011 | Chi | H01L 23/552 257/E21.705 |
| 2011/0186995 | A1* | 8/2011 | Alvarado | H01L 24/05 257/737 |
| 2011/0215472 | A1* | 9/2011 | Chandrasekaran | H01L 24/73 257/737 |
| 2011/0227220 | A1* | 9/2011 | Chen | H01L 25/16 438/109 |
| 2011/0298101 | A1* | 12/2011 | Pagaila | H01L 24/96 257/659 |
| 2012/0007227 | A1* | 1/2012 | Cho | H01L 24/96 257/686 |
| 2012/0161332 | A1* | 6/2012 | Chua | H01L 21/568 257/774 |
| 2012/0168944 | A1* | 7/2012 | Gan | H01L 21/76873 257/738 |
| 2012/0223429 | A1* | 9/2012 | Khan | H01L 21/565 257/737 |
| 2012/0225522 | A1* | 9/2012 | Zhao | H01L 23/49816 438/107 |
| 2012/0286411 | A1* | 11/2012 | Watanabe | H01L 24/97 257/676 |
| 2012/0326337 | A1* | 12/2012 | Camacho | H01L 24/96 257/782 |

(56) References Cited

U.S. PATENT DOCUMENTS

| | | | | |
|---|---|---|---|---|
| 2013/0075924 | A1* | 3/2013 | Lin | H01L 23/293 257/774 |
| 2013/0105991 | A1* | 5/2013 | Gan | H01L 25/105 257/777 |
| 2013/0161788 | A1* | 6/2013 | Chun | H01L 25/0657 257/532 |
| 2013/0168854 | A1* | 7/2013 | Karikalan | H01L 24/73 257/784 |
| 2013/0171774 | A1* | 7/2013 | Chen | H01L 25/105 438/121 |
| 2013/0175686 | A1* | 7/2013 | Meyer | H01L 24/19 257/738 |
| 2013/0175687 | A1* | 7/2013 | Hu | H01L 25/105 257/738 |
| 2013/0292851 | A1* | 11/2013 | Pagaila | H01L 24/25 257/774 |
| 2013/0299967 | A1* | 11/2013 | Daniels | H01L 24/03 257/737 |
| 2014/0077389 | A1* | 3/2014 | Shim | H01L 25/50 257/774 |
| 2014/0084441 | A1* | 3/2014 | Chiu | H01L 25/0657 257/692 |
| 2014/0103488 | A1* | 4/2014 | Chen | H01L 24/19 257/532 |
| 2014/0159228 | A1* | 6/2014 | Teh | H01L 23/3107 257/734 |
| 2015/0084208 | A1* | 3/2015 | Iida | H01L 23/66 257/774 |
| 2015/0145116 | A1* | 5/2015 | Uzoh | H01L 24/94 257/777 |
| 2015/0270247 | A1* | 9/2015 | Chen | H01L 21/4857 257/738 |
| 2015/0282367 | A1* | 10/2015 | Barth | H05K 13/00 361/729 |
| 2015/0318263 | A1* | 11/2015 | Yu | H01L 23/49816 438/109 |
| 2015/0359098 | A1* | 12/2015 | Ock | H05K 1/115 29/842 |
| 2016/0071818 | A1* | 3/2016 | Wang | H01L 24/89 257/774 |
| 2016/0085899 | A1* | 3/2016 | Qian | G06F 30/394 257/774 |
| 2016/0118333 | A1* | 4/2016 | Lin | H01L 22/20 257/773 |
| 2016/0133686 | A1* | 5/2016 | Liao | H01L 28/60 257/532 |
| 2016/0141234 | A1* | 5/2016 | We | H01L 23/5385 361/767 |
| 2016/0181211 | A1* | 6/2016 | Kamgaing | H01L 23/66 257/621 |
| 2016/0218063 | A1* | 7/2016 | Tsai | H01L 23/3171 |
| 2016/0218092 | A1* | 7/2016 | Chang | H01L 23/528 |
| 2016/0240492 | A1* | 8/2016 | Wolter | H01Q 1/2283 |
| 2016/0260684 | A1* | 9/2016 | Zhai | H01L 25/0652 |
| 2016/0260690 | A1* | 9/2016 | Ganesan | H01L 24/33 |
| 2016/0260695 | A1* | 9/2016 | Chung | H01L 23/481 |
| 2016/0315071 | A1* | 10/2016 | Zhai | H01L 24/24 |
| 2016/0343685 | A1* | 11/2016 | Lin | H01L 24/20 |
| 2016/0343695 | A1* | 11/2016 | Lin | H01L 21/565 |
| 2016/0358889 | A1* | 12/2016 | Lai | H01L 21/768 |
| 2017/0018476 | A1 | 1/2017 | Wang | |
| 2017/0141053 | A1* | 5/2017 | Chen | H01L 24/02 |
| 2017/0207170 | A1* | 7/2017 | Nair | H01L 23/5386 |
| 2017/0207205 | A1* | 7/2017 | Kim | H01L 21/565 |
| 2017/0294410 | A1* | 10/2017 | Haba | H01L 23/49551 |
| 2017/0330870 | A1* | 11/2017 | Chen | H01L 24/20 |
| 2017/0338207 | A1* | 11/2017 | Chen | H01L 24/19 |
| 2018/0025987 | A1* | 1/2018 | Tao | H01L 23/3128 257/668 |
| 2018/0026011 | A1* | 1/2018 | Tao | H01L 25/0652 257/774 |
| 2018/0026016 | A1* | 1/2018 | Tao | H01L 23/3114 257/774 |
| 2018/0026017 | A1* | 1/2018 | Tao | H01L 23/3114 257/668 |
| 2018/0026018 | A1* | 1/2018 | Tao | H01L 23/3128 257/738 |
| 2018/0026019 | A1* | 1/2018 | Tao | H01L 25/105 257/668 |
| 2018/0047571 | A1 | 2/2018 | Hunt | |
| 2018/0053746 | A1* | 2/2018 | Yu | H01L 24/97 |
| 2018/0061794 | A1* | 3/2018 | Kim | H01L 24/82 |
| 2018/0151501 | A1* | 5/2018 | Yu | H01L 23/3114 |
| 2018/0158784 | A1* | 6/2018 | Lee | H01L 25/50 |
| 2018/0286840 | A1* | 10/2018 | Nair | H01L 24/20 |
| 2018/0301350 | A1* | 10/2018 | Haba | H01L 24/92 |
| 2018/0331070 | A1* | 11/2018 | Seidemann | H01L 24/97 |
| 2018/0331080 | A1* | 11/2018 | Geissler | H01L 24/19 |
| 2019/0067219 | A1* | 2/2019 | Lasiter | H01Q 9/0407 |
| 2019/0088581 | A1* | 3/2019 | Yu | H01L 21/561 |
| 2019/0103386 | A1* | 4/2019 | Chen | H01L 21/568 |
| 2019/0148276 | A1* | 5/2019 | Chen | H01L 21/486 257/774 |
| 2019/0164783 | A1* | 5/2019 | Huang | H01L 24/96 |
| 2019/0164892 | A1* | 5/2019 | Franz | H01L 24/97 |
| 2019/0189599 | A1* | 6/2019 | Baloglu | H01L 23/367 |
| 2019/0206833 | A1* | 7/2019 | Meyer | H01L 24/12 |
| 2019/0214347 | A1* | 7/2019 | Huang | H01L 25/0657 |
| 2019/0287904 | A1* | 9/2019 | Seidemann | H01L 25/0652 |
| 2020/0126950 | A1* | 4/2020 | Lunde | H01L 23/49827 |
| 2020/0266163 | A1* | 8/2020 | Lee | H01L 21/6836 |
| 2021/0057367 | A1* | 2/2021 | Signorini | H01L 23/49827 |
| 2023/0054984 | A1* | 2/2023 | Kim | H01L 23/5386 |

FOREIGN PATENT DOCUMENTS

| | | | |
|---|---|---|---|
| TW | 200901413 | 1/2009 | |
| TW | 201312663 | 3/2013 | |
| TW | 201415586 | 4/2014 | |
| TW | 201727864 | 8/2017 | |
| WO | WO-2016007176 A1 * | 1/2016 | H01L 25/07 |

OTHER PUBLICATIONS

Machine translation, Notification Letter of Review Opinion from the Intellectual Property Bureau of the Ministry of Economic Affairs, Taiwan Application No. 108101190, mailed Nov. 16, 2022, translation date: Feb. 24, 2023, Google Translate. (Year: 2023).*

Office Action for Taiwan Patent Application No. 108101190 dated Sep. 7, 2022, 24 pgs., no translation.

Office Action for Taiwan Patent Application No. 108101190 dated Nov. 16, 2022, 13 pgs.

Notice of Allowance for Taiwan Patent Application No. 108101190 dated Mar. 23, 2023, 3 pgs., with English translation.

* cited by examiner

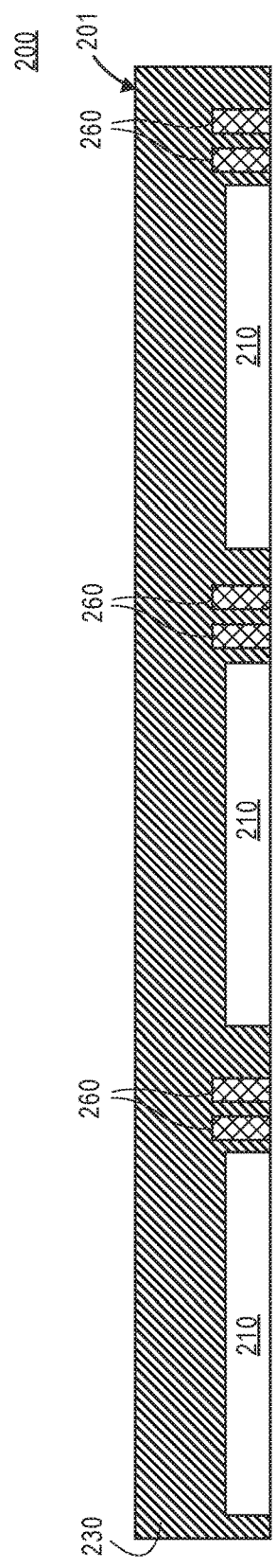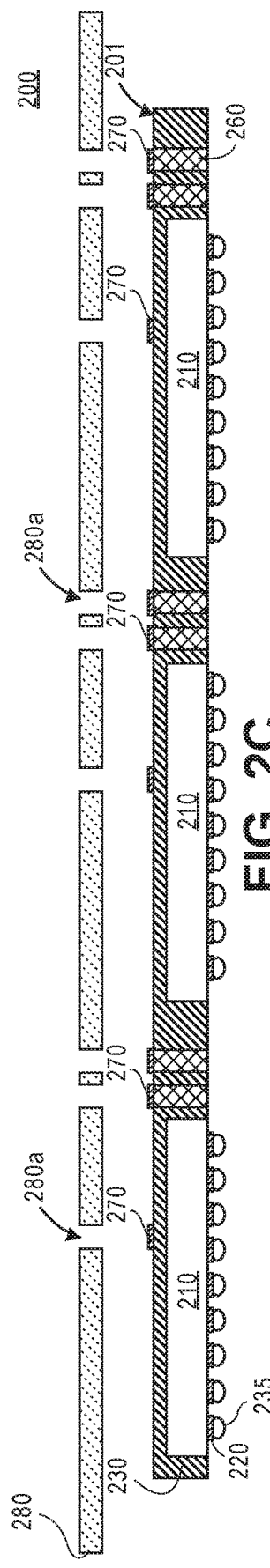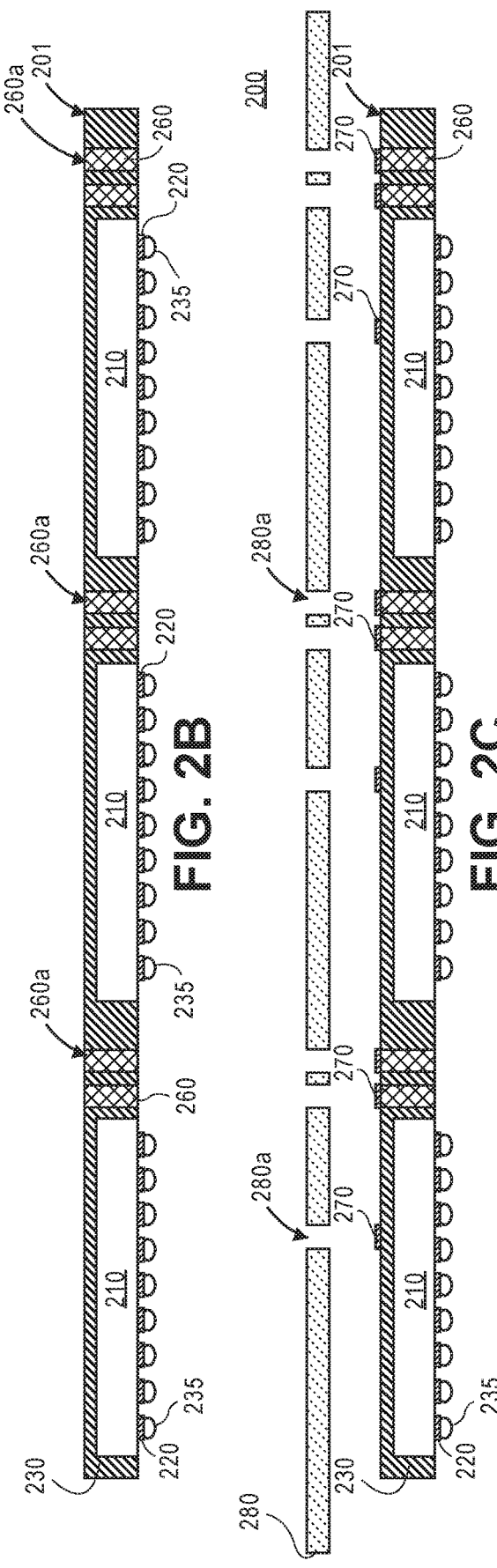

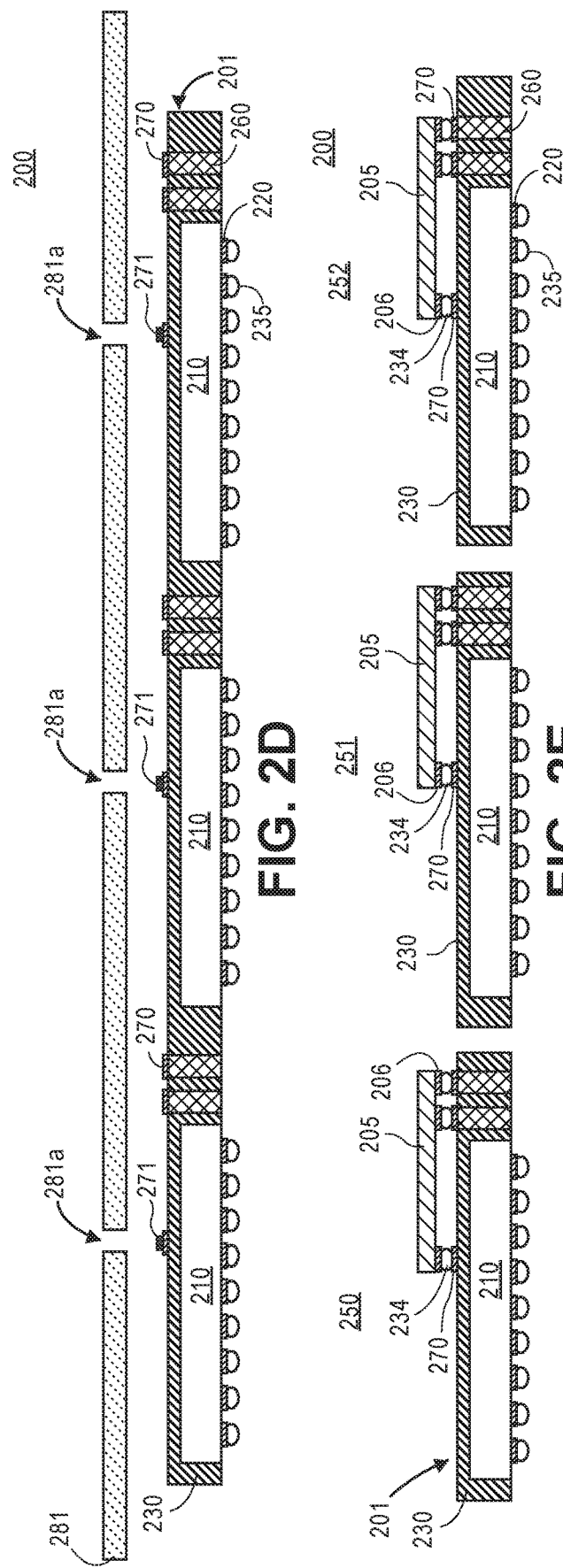

FAN OUT PACKAGING POP MECHANICAL ATTACH METHOD

FIELD

Embodiments relate to packaging semiconductor devices. More particularly, the embodiments relate to a fan-out packaging for a mechanical attachment of a package-on-package (POP).

BACKGROUND

Packaging of semiconductor devices, such as carrier dies or wafers, present several problems. One of the main problems with packaging a carrier die or a wafer includes a package-on-package (POP) package that utilize a fan-out packaging.

POP is an integrated circuit packaging technology in which a number of ball grid array (BGA) packages are arranged vertically, which ultimately increases the vertical interconnect area of the semiconductor device. Typically, POP packaging reduces the board area occupied by individually semiconductor devices. POP packaging also minimizes track length between components that frequently interoperate. Implementing POP thus provides more rapid signal propagation, reduced noise, and reduced channel cross-talk.

POP packages utilizing a fan-out package as the carrier may lead to some problems as the attachment of the top packages (e.g., a memory array, dies, etc.) can lead to a non-optimized overall package footprint. Furthermore, the POP package may require additional processes/assembly steps which increases the overall manufacturing costs and the risk of yield loss. For example, the attachment of a memory array or other chips to a fan-out wafer with caner chips is normally implemented with via bars, through-mold vias (TMVs), and/or a combination of via bars and TMVs with a complex backside redistribution layer (RDL) solution.

A via bar is typically disposed adjacent to the carrier chip (e.g., the via bar is on the left side of the chip) and required to mechanically support the top memory die on the carrier chip, while one or more via bars on the opposite end of the via bar (e.g., the via bars are on the right side of the chip) are used to transmit the electrical signals. This POP implementation forces the top memory die to be roughly the same size as the bottom carrier die, as such the sizes of both dies are not optimized. Accordingly, the existing POPs are not size optimized on either the carrier chip or the top package, thus causing wasted surface area and volume for the top package, while also requiring complex backside RDL solutions that are not cost-efficient.

BRIEF DESCRIPTION OF THE DRAWINGS

Embodiments described herein illustrated by way of example and not limitation in the figures of the accompanying drawings, in which like references indicate similar features. Furthermore, some conventional details have been omitted so as not to obscure from the inventive concepts described herein.

FIGS. 2A-2E are cross-sectional views of a process flow to form a semiconductor package with includes a mold layer, carrier dies, top dies, redistribution layers, patterned masks, and vias, according to some embodiments.

DETAILED DESCRIPTION

Described herein are systems that include semiconductor packages with package-on-package (POP) packaging and methods of forming such semiconductor packages. According to some embodiments, the semiconductor package described below and methods of forming such semiconductor package include a mold layer, a carrier die, a top die, one or more redistribution layers, patterned masks, and one or more vias. For some embodiments, the semiconductor packages described herein reduce the processing/assembly steps and thus reduce the risk of yield loss.

Figure 1A:
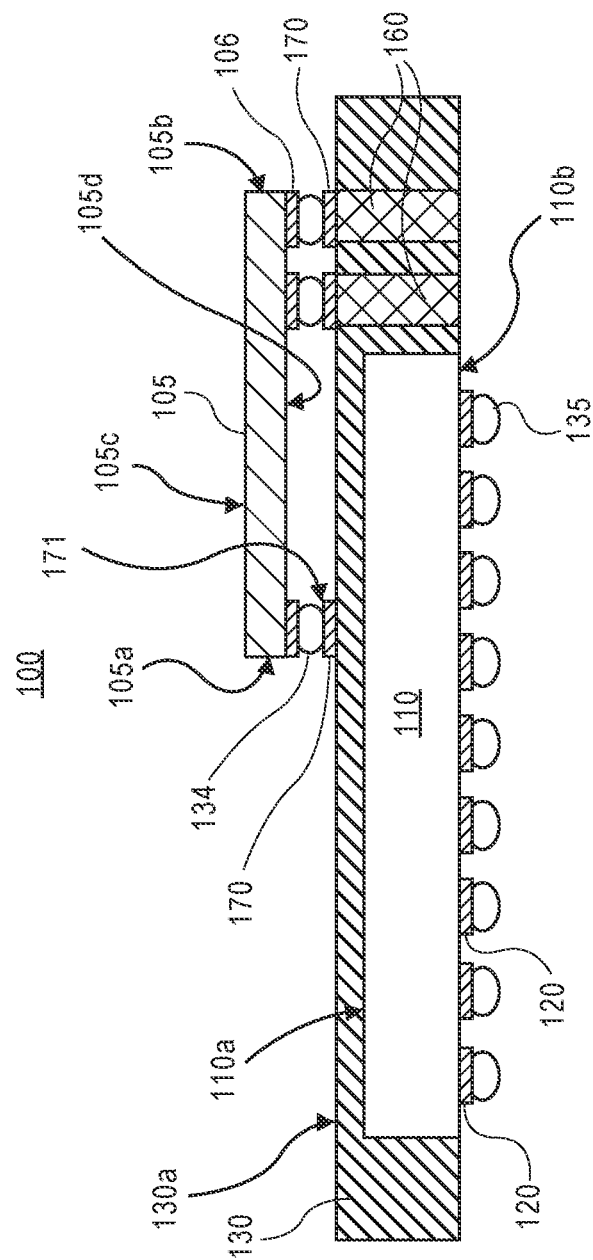
FIG. 1A is a cross-sectional view of a semiconductor package with a package-on-package (POP) implementation that includes a mold layer, a carrier die, a top die, a redistribution layer, and one or more vias, according to one embodiment.
Figure 1B:
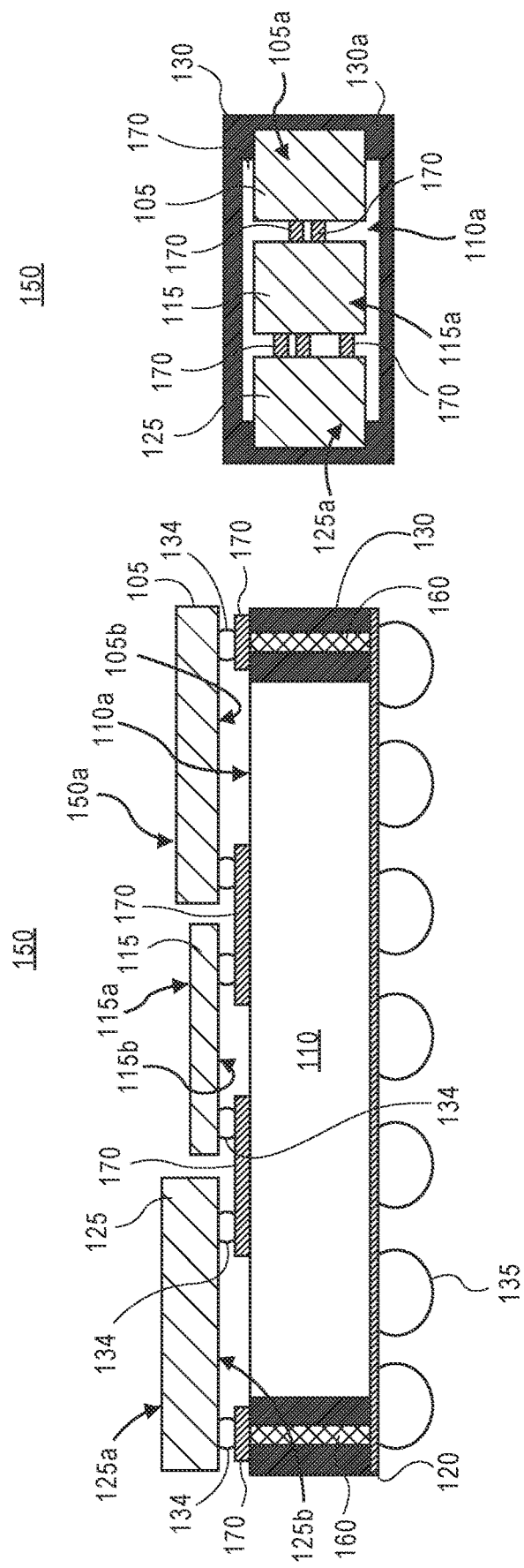
FIG. 1B is a cross-sectional view of a semiconductor package with a POP implementation that includes a mold layer, a carrier die, one or more top dies, a redistribution layer, and one or more vias, according to one embodiment.

According to some embodiments, a semiconductor package, such as a POP package, is described (e.g., the POP package 100 shown in FIGS. 1A-B). For one embodiment, the semiconductor package includes a mold layer/compound (or an encapsulation layer) disposed over and around a first die (e.g., a carrier die) and a first via (e.g., a first via may include a through-mold via (TMV), a via bar, etc.). For one embodiment, the semiconductor package has a first redistribution layer disposed directly on the top surface of the mold layer (e.g., as shown in FIGS. 2C-2D). For another embodiment, the semiconductor package has the first redistribution layer disposed directly on the top surface of the first die and the first via (e.g., as shown in FIG. 1B). For one embodiment, the first redistribution layer may include one or more conductive pads (or conductive traces/lines) (e.g., as shown in FIGS. 1A-1B). For an additional embodiment, the first redistribution layer may include the conductive pads (or the conductive traces/lines) and one or more under metal bump (UBM) pads (e.g., as shown in FIG. 2D). Additionally, for some additional embodiments, the first redistribution layer may include a packaging underfill material to provide an additional protection against corrosion if needed.

As used herein, a "redistribution layer" may refer to one or more interconnect layers that integrate a multi-layer interconnect structure and redistribution layers, thereby enabling flexibility with different pin configurations. In particular, as used herein, a "first redistribution layer" may refer to one or more interconnect layers (e.g., a second layer of UBM pads formed on a first layer of conductive pads/contacts/traces/lines) that: (i) enable a mechanical attachment for fan-out packaging (e.g., POP packaging), (ii) integrate a multi-layer interconnect structure and redistribution layers, (iii) enable the footprint/size reduction of the top dies, and (iv) thus optimize the additional space for further components to be placed on the molded carrier die. The first redistribution layer may be an additional interconnect layer(s) (e.g., a metal layer of Cu or the like) on the molded carrier die that makes the input/outputs (I/O) pads of an IC available in other locations. The first redistribution layer may be formed with the addition of one or more metal and/or dielectric layers disposed on the surface of the molded carrier die (or the encapsulated/molded wafer) to re-route the I/O layout into a new, looser pitch footprint. For example, such redistribution layer may comprise one or more different materials, such as thin film polymers, UBMs, and/or metals (e.g., Cu, Al, or the like), to interconnect one or more POP dies and improve the POP packaging by (i) optimizing one or more different footprints for the top dies, and (ii) reducing the POP assembly steps which reduces manufacturing costs and the risk of yield loss.

For one embodiment, the first redistribution layer may be formed of a single/first layer that includes conductive pads (or conductive elements, conductive contacts, conductive lines/traces, etc.). For one embodiment, the first redistribution layer may be disposed directly on, but not limited to, a top surface of a mold layer of a carrier die, a top surface of the carrier die, an adhesive layer on the top surface of the mold layer and/or the carrier die, and/or a top surface of a substrate having a carrier die. It should be noted that for purposes of illustration, embodiments of the first redistribution layer having at least one or two interconnect layers are illustrated. In other embodiments, processes such as those described herein or other similar processes may be used to create a multi-layer redistribution structure having more than two interconnect layers.

As used herein, a "conductive pad" may refer to a conductive element/material, such as a conductive pad, a conductive line/trace, and a conductive plane, that forms the first redistribution layer on the surface of a mold layer, a carrier/bottom die, and a via (e.g., a via bar, a TMV, etc.). For example, a conductive pad of the first redistribution layer may be used to couple two or more top dies on the same, single conductive pad (as shown in FIG. 1B).

The semiconductor package further includes a second die (e.g., a memory die, a top package, etc.) having a solder ball coupled to a die pad on a bottom surface of the second die, where the solder ball of the second die is disposed on the first redistribution layer to couple the second die to the first die (e.g., as shown in FIGS. 1A-1B and 2E). Note that, for one embodiment, the die pad on the second die may be omitted if desired based on the packaging design. For one embodiment, the second die has a first edge and a second edge that is opposite from the first edge (e.g., a first edge 105a and a second edge 105b as shown in FIG. 1), as the first edge of the second die is positioned (or disposed) within a footprint of the first die, and the second edge of the second die may be positioned outside the footprint of the first die (e.g., as shown in FIG. 1).

As used herein, a "footprint" may refer to a surface space (or an amount of surface space) occupied by a structure or a component, such as a die. For example, the first die may have a footprint that is greater than a footprint of the second die. In addition, as used herein, an "offset" may refer to the difference in footprint between a first footprint and a second footprint. As such, embodiments of the semiconductor package may include an offset between the footprint of the first die and the footprint of the second die that improves (or optimizes) the overall dimensions of the POP by (i) enabling a size reduction of the second die (or the top die) and (ii) facilitating more surface space for additional components (e.g., integrated circuit (IC) packages, passive components, other dies, etc.) to be disposed on the mold layer above the first die (i.e., a third die may be disposed on the remaining surface space and/or a portion of the remaining surface space above the first die as shown in FIG. 1B).

For some additional embodiments, the first redistribution layer may include the UBM pad disposed on the conductive pad as the conductive pad may be disposed directly on at least one of the mold layer and the first die (e.g., as shown in FIGS. 1B and 2D). The semiconductor package may also have a second redistribution layer disposed on a bottom surface of the first die, and a second via disposed adjacently to the first via, where the second via extends through the mold. For one embodiment, the first redistribution layer may include one or more via conductive pads disposed on at least one of the first via and the second via (e.g., as shown in FIG. 2C). In one embodiment, the semiconductor package may have the solder ball of the second die disposed on the UBM pad that is on the conductive pad, where the second die is coupled to the conductive pad, the first via, and the second via.

Embodiments of the semiconductor package enhance packaging solutions by providing the backside of the molded carrier package—at a wafer level or a package level—to be subjected to, for example, a sputter or evaporation process using one or more metal shadow masks that help form a redistribution layer on the backside of the molded carrier package. For example, these masks are patterned with openings to dispose the redistribution layer/structure on the backside of the wafer, which includes the molded carrier packages (or dies). Accordingly, the subsequent redistribution layers/structures disposed on the mold layer above the carrier package may be used to attach (or couple) the top package onto the redistribution layer(s) on the mold layer above the carrier package—and thus assembling a POP without the need for lithography or etching.

In addition, embodiments of the semiconductor package improve packaging solutions by implementing redistribution layers directly on the mold layer above the carrier die at the panel level and/or the wafer level. These embodiments of the semiconductor package also improve the existing POP packaging by requiring reduced processing time and steps, which thus lowers the overall yield risk. Furthermore, as described herein, the overall dimensions of the POP are optimized with the reduction of the footprint of the top die which allows more space for further components to be disposed on the carrier die (e.g., as shown in FIG. 1B).

In the following description, various aspects of the illustrative implementations will be described using terms commonly employed by those skilled in the art to convey the substance of their work to others skilled in the art. However, it will be apparent to those skilled in the art that the present embodiments may be practiced with only some of the described aspects. For purposes of explanation, specific numbers, materials and configurations are set forth in order to provide a thorough understanding of the illustrative implementations. However, it will be apparent to one skilled in the art that the present embodiments may be practiced without the specific details. In other instances, well-known features are omitted or simplified in order not to obscure the illustrative implementations.

Various operations will be described as multiple discrete operations, in turn, in a manner that is most helpful in understanding the present embodiments, however, the order of description should not be construed to imply that these operations are necessarily order dependent. In particular, these operations need not be performed in the order of presentation.

As used herein the terms "top," "bottom," "upper," "lower," "lowermost," and "uppermost" when used in relationship to one or more elements are intended to convey a relative rather than absolute physical configuration. Thus, an element described as an "uppermost element" or a "top element" in a device may instead form the "lowermost element" or "bottom element" in the device when the device is inverted. Similarly, an element described as the "lowermost element" or "bottom element" in the device may instead form the "uppermost element" or "top element" in the device when the device is inverted.

FIG. 1A is a cross-sectional view of a semiconductor package 100 with a POP implementation. For one embodiment, the semiconductor package 100 includes a carrier die 110, a top die 105, a mold layer 130, one or more vias 160, and a first redistribution layer 170. In some embodiments, the semiconductor package 100 is a POP that utilizes the first redistribution layer 170 to couple the top die 105 on the carrier die 110 (or a molded carrier die/package) without requiring additional lithography and/or etching processing steps. Note that the semiconductor package 100 may be assembled at the panel level and/or the wafer level. By way of example, a molded carrier die may be referred to as a carrier die having a mold layer over and around the carrier die. Also note the illustrated vias 160 may be formed as, but not limited to, via bars and TMVs, where a TMV may need a pad disposed below the TMV. It is to be appreciated that the vias 160 are illustrated in the Figures as having one shape in order to not unnecessarily obscure embodiments of the invention (i.e., the vias 160 may be a via bar and/or a TMV).

According to some embodiments, the semiconductor package 100 includes the mold layer 130 (or an encapsulation layer) disposed over and around a top surface 110a of the carrier die 110 (or a first die) and the vias 160. For one embodiment, the semiconductor package 100 may include one or more vias 160 (i.e., the semiconductor package may have a via bar, a TMV, or a combination of two or more TMVs/via bars based on the desired packaging design). For some embodiments, the semiconductor package 100 may also include TMVs and/or via bars (or vias, via pillars, etc.) (e.g., as shown in FIG. 1B). For one embodiment, the vias 160 may be formed adjacent to any edge of the carrier die 110 (e.g., formed on the left side rather than the right side, or one via on one edge and the other via on the opposite edge). For one embodiment, the vias 160 are disposed adjacent to each other and positioned vertically on one of the edges of the carrier die 110. For one embodiment, the vias 160 have a z-height greater than a z-height of the carrier die 110. For another embodiment, the vias 160 may have a roughly similar/equal z-height as the carrier die 110 (e.g., as shown in FIG. 1B).

For one embodiment, the carrier die 110 may include, but is not limited to, a semiconductor die, a package (e.g., a carrier wafer package), an electronic device (e.g., a wireless device), an integrated circuit (IC), a central processing unit (CPU), a microprocessor, a platform controller hub (PCH), a memory, and a field-programmable gate array (FPGA). The carrier die 110 may be formed from a material such as silicon and have circuitry thereon that may be coupled to another substrate, for example, a computer motherboard.

For one embodiment, the mold layer 130 is made of an epoxy (e.g., a soft epoxy, a stiff epoxy, opaque epoxy, etc.) with one or more filler materials. According to some embodiments, the one or more materials for the mold layer 130 may include, but are not limited to, ultra-compliant materials for semiconductor devices, pressure sensors, visible light, ultraviolet (UV) and infrared (IR) absorbing/reflective materials to block photons from the dies, stiff polymers to encapsulate the interconnects and/or wire bonds, and/or transparent materials for an energy harvest (e.g., a solar cell).

For one embodiment, the semiconductor package 100 uses the first redistribution layer 170 to mount/couple (or mechanically attach) the top die 105 on a top surface 130a of the molded carrier die 110. In one embodiment, the first redistribution layer 170 is disposed on the top surface 130a of the mold layer 130, as the first redistribution layer 170 may include one or more conductive pads 170 (i.e., the first redistribution layer 170 may be formed from the one or more conductive pads 170). For other embodiments, the mold layer 130 may be further recessed to expose the top surface 110a of the carrier die 110 (when the vias 160 may be co-planar to the top surface 110a of the carrier die 110 and may have a roughly similar or equal z-height to the carrier die 110), as the first redistribution layer 170 may have the one or more conductive pads/traces disposed directly on the top surface 110a of the carrier die and the vias 160.

For another embodiment, the first redistribution layer 170 is disposed directly on a top surface 130a of the mold layer 130, as the first redistribution layer 170 may include one or more conductive pads 170 and one or more UBM pads 171. Note that the UBM pads 171 may be added/formed on the conductive pads 170 as an optional embodiment (i.e., the redistribution layer 170 may be formed with the conductive pads only). For example, the first redistribution layer 170 may include a first layer of conductive pads 170 and then a second layer of UBM pads 171 disposed on the first layer of conductive pads 170 (e.g., as also shown in FIG. 2D). For other embodiments, the redistribution layer 170 may be formed directly on an encapsulated layer (e.g., the mold layer), an adhesive layer, and/or a die (e.g., using cold spray), and/or may be routed (or formed) over a layer of polymer based on the desired packaging design.

Referring back to FIG. 1, for one embodiment, the first redistribution layer 170 is disposed (or sputtered) only over the top surface 130a of the mold layer 130. For an additional embodiment, the first redistribution layer 170 is disposed over both the surface 130a of the mold layer 130 and the exposed portions of the vias 160. In an embodiment, the first redistribution layer 170 may be formed by sputtering (or disposing/depositing) a conformal conductive layer, such as a layer of Cu, Ni, Sn, Au, Ag, Al, an Al alloy, W, Ti, Ta, TiN, TaN, or the like, using any suitable method, including evaporation, sputter, electroplating, printing, jetting, stud bumping, direct placement, or the like. For one embodiment, the first redistribution layer 170 is patterned and disposed on the top surface 130a of the mold layer to form the conductive pads 170 (or the conductive elements/contacts) that act as the conductive pads and redistribution lines of the first redistribution layer 170. Note that the first redistribution layer 170 may include the conductive pad(s) 170 without needing a UBM pad.

In one embodiment, the redistribution layer 170 may be illustrated with two first conductive pads (or via contacts) along the right side roughly overlying (or on) the vias 160, and another one first conductive pad along the left side, where this one first conductive pad is not directly overlying a via and is rather on the top surface 130a of the mold layer 130 above the top surface 110a of the carrier die 110. The first conductive pads 170 acts as a first redistribution layer in that the conductive pads/elements act to provide an electrical connection to the vias 160 and to provide redistribution lines that couple the top die 105 to the carrier die 110.

According to some embodiments, the one conductive pad 170 on the left side and disposed above the carrier die 110 may, if desired based on the packaging design, be positioned within a footprint of the carrier die 110 and positioned to couple a first edge 105a of the top die 105. For one embodiment, this one conductive pad 170 may be disposed above the molded carrier die 110 to provide mechanical support to the top die 105. For some embodiments, the two first conductive pads 170 on the right side and disposed on the vias 160 may, if desired based on the packaging design, be positioned outside the footprint of the first die 110 and positioned to couple a second edge 105b of the top die 105 to the vias 160. For one embodiment, the two conductive pads 170 may be disposed and coupled to the vias 160 to transmit the electrical signals of at least one of the top die 105, the carrier die 110, and one or more electrical components (e.g., a printed circuit board, a third die, etc.).

The semiconductor package further includes the top die 105 (or a second die) having solder balls 134 coupled to die pads 106 on a bottom surface 105d of the top die 105. For one embodiment, the top die 105 may include, but is not limited to, a semiconductor die, a top package, an electronic device (e.g., a wireless device), an IC, a CPU, a microprocessor, a PCH, a memory, and a FPGA. The top die 105 may be formed from a material such as silicon and have circuitry thereon that may be coupled to another substrate and/or another die, such as the carrier die 110.

For one embodiment, the top die 105 is disposed on the first redistribution layer 170 to couple the top die 105 to the carrier die 110. For one embodiment, the die pads 106 and the solder balls 134 on the bottom surface 105d of the top die 105 are coupled to the first redistribution layer 170, thus coupling the top die 105 to the carrier die 110 with the first redistribution layer 170 and the vias 160. Note that, for one embodiment, the two conductive pads 170 on the vias 160 may be omitted as such one or more of the solder balls 134 of the top die 105 may be coupled directly on the exposed surfaces of the vias 160. In this embodiment, when the conductive pads 170 are not disposed on the exposed vias 160 but are disposed on the mold layer 130, one or more of the solder balls 134 of the top die 105 may have a greater pitch size than the other/remaining solder balls 134 of the top die 105.

For one embodiment, as described above, the top die 105 has the first edge 105a on the left side and the second edge 105b on the right side, as the second edge 105b is opposite from the first edge 105a. The top die 105 may have the first edge 105a positioned (or disposed) within a footprint of the carrier die 110 and the second edge 105b positioned outside the footprint of the carrier die 110. In one embodiment, the footprint of top die 105 extends beyond the footprint of the carrier die 110, as the surface area of the carrier die 110 may be greater than the surface area of the top die 105. In this embodiment, the semiconductor package 100 may have extra (or additional/remaining) surface area or space above the footprint of the carrier die 110, where, but not limited to, an additional die, an IC, an electronic component, and/or a package may be added on the remaining surface area above the carrier die 110 and may be adjacent to the top die 105. Additionally, for one embodiment, the top die 105 may have one or more dies stacked above a top surface 105c of the top die 105 (i.e., the semiconductor package 100 may include three-dimensional (3D) stacked dies).

In an alternate embodiment, the surface area of the carrier die 110 may be smaller than the surface area of the top die 105 (if desired based on the packaging design), which may be enabled by the first redistribution layer 170. For one embodiment, a second redistribution layer 120 may be formed on a bottom surface 110b of the carrier die 110, as the second redistribution layer 120 includes solder balls 135 which may be used to couple the carrier die 110 to a substrate (e.g., a printed circuit board (PCB), a motherboard, a package, an electronic device, etc.).

Note that semiconductor package 100 of FIG. 1A may include fewer or additional packaging components based on the desired packaging design.

FIG. 1B is a cross-sectional view and a respective plan view of a semiconductor package 150 with a POP implementation. The semiconductor package 150 is similar to the semiconductor package 100 of FIG. 1A, but the semiconductor package 150 may have two or more electronic devices, such as the top dies 105, 115, and 125, disposed above the carrier die 110. Note that the additional space above the carrier die 110 may be used for an additional die (e.g., the top dies 115 and 125) but may also include, but is not limited to, any other one or more packaging components, such as ICs, packages/substrates, passive components, dies, discrete components (e.g., an inductor and a capacitor), and/or any additional components.

For one embodiment, the semiconductor package 150 uses the first redistribution layer 170 to mount/couple (or mechanically attach) the top dies 105, 115, and 125 on the top surface 110a of the molded carrier die 110. For one embodiment, the footprint of the top die 105 extends beyond the footprint of the carrier die 110 (to the right side of the carrier die 110), the footprint of the top die 115 is within the footprint of the carrier die 110, and the footprint of the top die 125 extends beyond the footprint of the carrier die 110 (to the left side of the carrier die 100). In one embodiment, the redistribution layer 170 has one or more conductive pads to couple the top dies 105, 115, and 125 to the top surface 110a of the carrier die 110. For one embodiment, as shown in the top/plan view, the redistribution layer 170 may have two conductive pads (or conductive lines) to couple the top dies 105 and 115, and may have three conductive pads to couple the top dies 115 and 125. In addition, the redistribution layer 170 allows the top die 115 to be disposed completely within the footprint of the carrier die 110 and be mounted/attached to the top surface 110a of the carrier die 110 without needing a via bar and/or a TMV.

For one embodiment, as discussed above, the top die 105 may be disposed above the carrier die 110 using one via 160 (rather than two vias 160 as shown in FIG. 1A). Moreover, the vias 160 may be through-mold vias and/or via bars/pillars. Note that, for other embodiments, the top dies 105 and 125 may be coupled to two or more vias if desired. For another embodiment, the redistribution layer 170 may be used to couple four top dies as each top die may be positioned on one corner of the carrier die 110 (as each top die may extend beyond the corner footprint of the carrier die). Furthermore, as shown with the top view of the semiconductor package 150, the top dies 105, 115, and 125 have exposed top surfaces 105c, 115a, and 125a while the bottom surfaces (105d, 115b, and 125b as shown with the cross-sectional view) of the top dies 105, 115, and 125 are parallel to the first redistribution layer 170 and the top surface 110a of the carrier die 110. Additionally, for some embodiments, the top dies 105, 115, and 125 may have one or more dies (e.g., 3D stacked dies) stacked above at least one of the exposed top surfaces 105c, 115a, and 125a of the top dies 105, 115, and 125.

Note that semiconductor package 150 of FIG. 1B may include fewer or additional packaging components based on the desired packaging design.

FIGS. 2A-2E are cross-sectional views of a process flow 200 to form a semiconductor wafer 201 includes a mold layer 230, carrier dies 210, top dies 205, redistribution layer(s) 270, patterned masks 280-281, and Vias 260, according to some embodiments. For one embodiment, the process flow 200 includes one or more steps used to form the semiconductor wafer 201 which may be diced to create the semiconductor packages as described herein (e.g., the semiconductor packages 100 and 150 of FIGS. 1A-1B). In addition, the process flow 200 may be used to form the semiconductor packages described herein (e.g., the semiconductor packages 100 and 150 of FIGS. 1A-1B) at the panel level (i.e., the semiconductor packages may be formed with a similar process flow implemented for fan-out panel-level packaging (FOPLP)). Note that the semiconductor packages formed by the process flow 200 (e.g., as shown in FIG. 2E) may be similar to the semiconductor packages of FIGS. 1A-1B, where the semiconductor packages as shown in FIG. 2E may include fewer or additional packaging components based on the desired packaging design. In addition, the illustration of FIGS. 2A-2E of the semiconductor wafer 201 may only show a portion of the semiconductor wafer 201. Also note that in FIGS. 2A-2E the vias 260 (or via bars) may be disposed/placed at the same time as the carrier die 210 (or embedded chip).

FIG. 2A illustrates one or more molded carrier dies 210 with vias 260 on the right side of each of the molded carrier dies 210. For one embodiment, the carrier dies 210 have the mold layer 230 disposed over and around the carrier dies 210 and the vias 260. In one embodiment, the vias 260 may be formed on any of the edges of the carrier dies 210, and the vias 260 may be formed with one via, two vias, or two or more vias based on, for example, the size of the top dies, the electrical requirements of the top dies, and/or the pattern of the redistribution layer. Additionally, for some embodiments, the carrier dies 210 may be utilized as fan-out wafer-level packaging (FOWLP) dies that may be placed either in the up or down position (e.g., as shown in FIG. 2A, the carrier dies are in the down position). For one embodiment, the semiconductor wafer 201 may be laminated to a dicing tape (e.g., a thermal release tape) on a wafer carrier (e.g., a glass carrier).

The semiconductor wafer 201 includes the mold layer 230, which may be implemented as compression molded to encapsulate the semiconductor wafer 201. Note that as shown in FIG. 2A the semiconductor wafer 201 may have been removed from the tape and the wafer carrier. For example, the mold layer 230 may be used to carry the fan-out area of the semiconductor wafer 201 and to protect the backside of the carrier dies 210.

Note that semiconductor wafer 201 of FIG. 2A may include fewer or additional packaging components based on the desired packaging design.

FIG. 2B illustrates disposing a second redistribution layer 220 with solder balls 235 on the bottom surfaces of the carrier dies 210. In addition, FIG. 2B also illustrates a thinning/grinding process performed on the backside of the semiconductor wafer 201 to expose a plurality of top surfaces 260a of the vias 260 in accordance with an embodiment. For some embodiments, the thinning process may grind the mold layer 230 to expose the vias 260, where the thinning process may be performed using a mechanical grinding process, a chemical mechanical polishing (CMP) process, a wet or dry etching process, and/or a combination thereof. For an alternate embodiment, the vias 260 may be formed at this stage of the process flow 200 after grinding the backside of the semiconductor wafer 201 to the final/desired thickness. Accordingly, the vias 260 may be omitted from FIG. 2A and alternatively formed at this stage of the process flow 200 in FIG. 2B.

Note that semiconductor wafer 201 of FIG. 2B may include fewer or additional packaging components based on the desired packaging design.

FIG. 2C illustrates a first patterned mask 280 disposed on the backside of the semiconductor wafer 201 to form the first redistribution layer 270. For one embodiment, the first patterned mask 280 has a plurality of openings 280a used to create the first redistribution layer 270 on the mold layer 230 and the top surfaces 260a of the vias 260. For an alternate embodiment, as described above, the first redistribution layer 270 may be formed only on the mold layer 230 while leaving the top surfaces 260a of the vias 260 exposed. For another embodiment, the first redistribution layer 270 may be disposed on the mold layer 230 and one of the two adjacent vias 260 on the right side of each carrier die 210.

For one embodiment, the openings 280a of the first patterned mask 280 define the portions of the first redistribution layer 270 that may act as conductive pads and redistribution lines. For one embodiment, the first patterned mask 280 may be a patterned photoresist mask, a hard mask, a combination thereof, or the like. In an embodiment, a first conductive material (e.g., Cu, Al, Au, Ni, Ag, or the like) may be disposed through the openings 280a of the first patterned mask 280 to form the one or more conductive pads (or conductive lines/traces) of the first redistribution layer 270 using any suitable method, for example, a sputtering process, an evaporation process, a printing process (e.g., a 3D printing process), a jetting process, an electroplating process, or the like. For other embodiments, the first patterned mask 280 may include additional openings (such as the openings 280a) used to form additional conductive pads of the first redistribution layer 270 that may accommodate two or more components above each of the carrier dies 210 (e.g., the two or more components above the carrier die as shown in FIG. 1B).

For one embodiment, the first redistribution layer 270 can be a single layer of metal conductive pads and/or one or more stacked metal pads and layers, such as Ti/Al/Ti, Cu, Al, Ni/Cu, Cr/Cu/Cr, or the like. For one embodiment, the first conductive material used for the first redistribution layer 270 may be formed into circular or rectangular patterns to create the conductive pads (or conductive traces, landing pads, etc.). The conductive pads 270 may be used to provide connection points for subsequent POP packaging. The conductive pads 270 may be a single layer of metal or a stack of metal layers such as Al, Al/Ni/Cu, Ti/Al/Ti, Cu, Ni/Au/Cu, or the like.

Note that semiconductor wafer 201 of FIG. 2C may include fewer or additional packaging components based on the desired packaging design.

FIG. 2D illustrates a second patterned mask 281 disposed on the backside of the semiconductor wafer 201 to form the first redistribution layer 270. For one embodiment, the second patterned mask 281 has a plurality of openings 281a used to form UBM pads 271 on the conductive pad of the first redistribution layer 270 within the footprint of each of the carrier dies 210 (i.e., the UBM pads 271 are disposed on the conductive pads 270 on the left side and not on the conductive pads 270 on the right side that are positioned above the vias 260). For one embodiment, the UBM pads 271 of the first redistribution layer 270 may be formed of a different material than the material used to form the conductive pads 270. For an alternate embodiment, as described above, the first redistribution layer 270 may omit the UBM pads 271, where the top dies may thus be coupled directly to the conductive pads 270 without forming UBM pads between the conductive pads 270 and the solder balls of the top dies.

For one embodiment, the openings 281a of the second patterned mask 281 define the portions of the first redistribution layer 270 that may act as the UBM pads to provide improved bonding between the conductive pads of the first redistribution layer 270 and the die pads of the top dies. For one embodiment, the second patterned mask 281 may be a patterned photoresist mask, a hard mask, a combination thereof, or the like. In an embodiment, a second conductive material (e.g., Cu, Al, Au, Ni, Ag, a combination therein, or the like) may be disposed through the openings 281a of the second patterned mask 281 to form the one or more UBM pads 271 of the first redistribution layer 270 using any suitable method, for example, a sputtering process, an evaporation process, a printing process (e.g., a 3D printing process), a jetting process, an electroplating process, or the like. For one embodiment, the first conductive material of the conductive pads 270 may be the same or different from the second material of the UBM pads 271. For other embodiments, the second patterned mask 281 may include additional openings (such as the openings 281a) used to form additional UBM pads 271 of the first redistribution layer 270 that may accommodate two or more components above each of the carrier dies 210 (e.g., the two or more components above the carrier die as shown in FIG. 1B). Additionally, for one embodiment, the second patterned mask 281 may include additional openings (such as the openings 281a) used to form additional UBM pads 271 on one or more of the remaining conductive pads of the first redistribution layer 270 (i.e., one or more additional UBM pads 271 may be formed on one or more of the conductive pads 270 that are positioned on the vias 260). Note that, for one embodiment, the diameter of the UBM pad 271 may be equal or less than the diameter of the conductive pad 270.

Note that semiconductor package 150 of FIG. 1B may include fewer or additional packaging components based on the desired packaging design.

FIG. 2E illustrates the semiconductor wafer 201 diced/sawed into semiconductor packages 250-252. For one embodiment, a singulation process may be used to dice/saw the semiconductor wafer 201 into the semiconductor packages 250-252, where the singulation process may be implemented with any suitable method such as using a saw blade, a laser, etc. In addition, after each of the semiconductor packages 250-252 is singulated, each of the top dies 205 with die pads 206 and solder balls 234 are disposed to the corresponding first redistribution layers 270 of each of the corresponding semiconductor packages 250-252 to form the POP as described herein. For additional embodiments, one or more dies/components (e.g., the die 115 as shown in FIG. 1B) may be added adjacent to the top die 205 (e.g., on the left side of the top die 205 or anywhere in the remaining footprint above the carrier die 210) and/or stacked above the top die 205.

Note that semiconductor packages 250-252 of FIG. 2E may include fewer or additional packaging components based on the desired packaging design.

Figure 3:
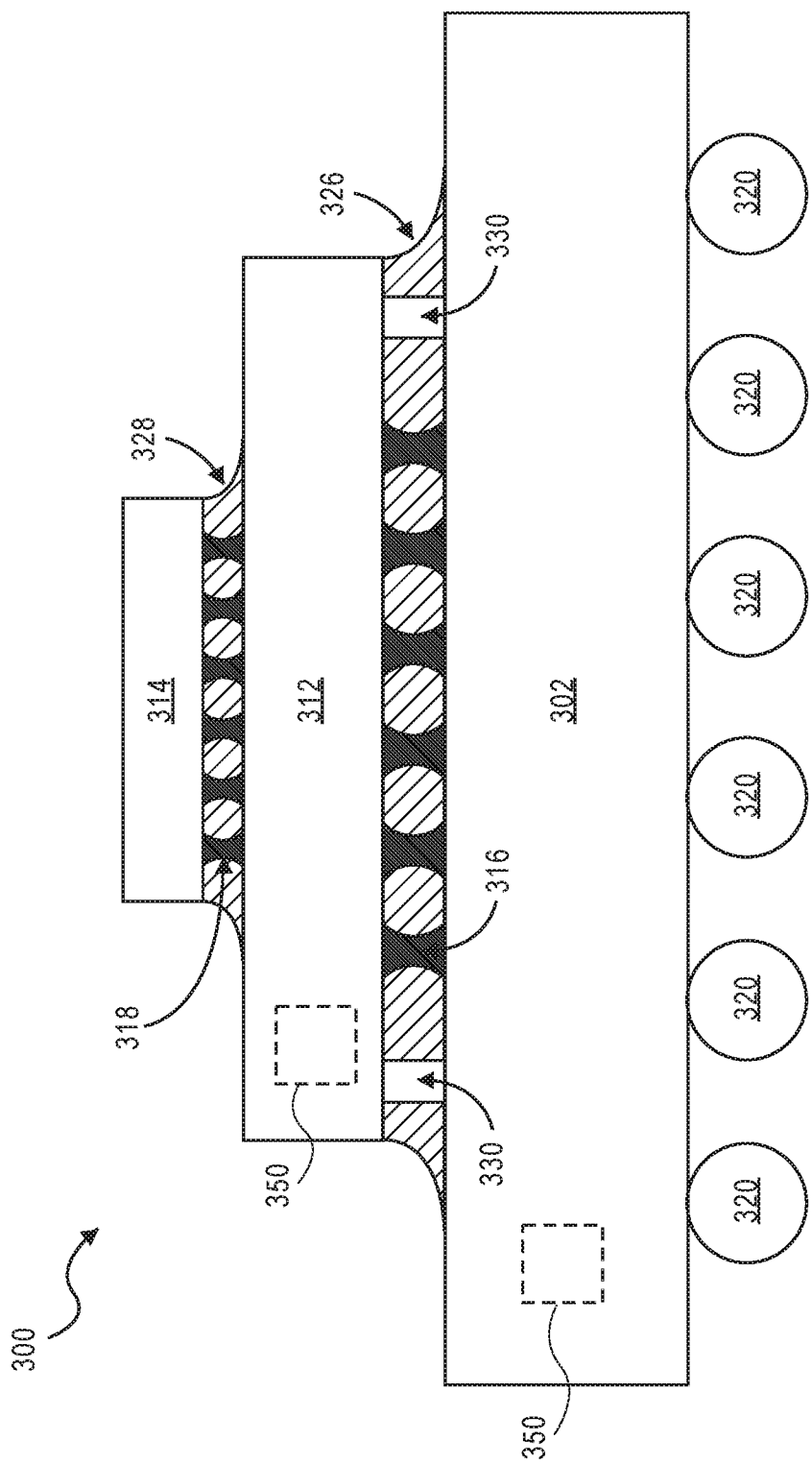
FIG. 3 is a cross-sectional view of a semiconductor packaged system having one or more POPs, a packaged substrate, a substrate, and a die, according to one embodiment.

FIG. 3 is a cross-sectional view of a semiconductor package 300 (or a semiconductor packaged system) having one or more package-on-packages (POPs) 350, a package substrate 302, a substrate 312, and a die 314, according to one embodiment. Specifically, FIG. 3 illustrates the POPs 350 (e.g., such as the semiconductor packages described herein) having a carrier die, a top die(s), a mold layer, one or more vias, and a first redistribution layer, according to some embodiments. Note that the POPs 350 may be similar to the semiconductor packages 100, 150, and 250-252 of FIGS. 1A-1B and 2E.

For one embodiment, the semiconductor package 300 is merely one example of an embodiment wherein an integrated circuit die 314 is coupled to a substrate (e.g., an interposer) 312 via one or more solder bumps/joints formed from respective microbumps. For one embodiment, a solder ball (or a solder joint) formed by soldering of a microbump according to an embodiment may itself be referred to as a "bump" and/or a "microbump." For some embodiments, the semiconductor package 300 may have a die 314 disposed on an interposer 312, where both the stacked die 314 and interposer 312 are disposed on a package substrate 302. According to some embodiments, the package substrate 302 may include, but is not limited to, a package, a substrate, a PCB, and a motherboard. For one embodiment, the package substrate 302 is a PCB. For one embodiment, the PCB is made of an FR-4 glass epoxy base with thin copper foil laminated on both sides. For certain embodiments, a multilayer PCB can be used, with pre-preg and copper foil used to make additional layers. For example, the multilayer PCB may include one or more dielectric layers, where each dielectric layer can be a photosensitive dielectric layer. For some embodiments, holes may be drilled in the PCB 302. For one embodiment, the PCB 302 may also include conductive copper traces, metallic pads, and holes.

For one embodiment, the die 314 may include, but is not limited to, a semiconductor die, an electronic device (e.g., a wireless device), an IC, a CPU, a microprocessor, a PCH, a memory, and a FPGA. The die 314 may be formed from a material such as silicon and have circuitry thereon that is to be coupled to the interposer 312. Although some embodiments are not limited in this regard, the package substrate 302 may in turn be coupled to another body, for example, a computer motherboard. One or more connections between the package substrate 302, the interposer 312, and the die 314—e.g., including some or all of bumps 316, 318, and 320—may include one more interconnect structures. In some embodiments, these interconnect structures (or connections) may variously comprise an alloy of nickel, palladium, and tin (and, in some embodiments, copper).

Connections between the package substrate 302 and another body may be made using any suitable structure, such as the illustrative bumps 320 shown. The package substrate 302 may include a variety of electronic structures formed thereon or therein. The interposer 312 may also include electronic structures formed thereon or therein, which may be used to couple the die 314 to the package substrate 302. For one embodiment, one or more different materials may be used for forming the package substrate and the interposer. In certain embodiments, the package substrate 302 is an organic substrate made up of one or more layers of polymer base material, with conducting regions for transmitting signals. In certain embodiments, the interposer 312 is made up of a ceramic base material including metal regions for transmitting signals. Although some embodiments are not limited in this regard, the semiconductor package 300 may include gap control structures 330—e.g., positioned between the package substrate 302 and the interposer 312. Such gap control structures 330 may mitigate a change in the height of the gap between the package substrate 302 and the interposer 312, which otherwise might occur during reflowing while die 314 is attached to interposer 312. Note that the semiconductor package 300 includes an underflow material 328 between the interposer 312 and the die 314, and an underflow material 326 between the package substrate 302 and the interposer 312. The underflow materials (or layers) 326 and 328 may be one or more polymers that are injected between the layers.

Note that the semiconductor package 300 may include fewer or additional packaging components based on the desired packaging design.

Figure 4:
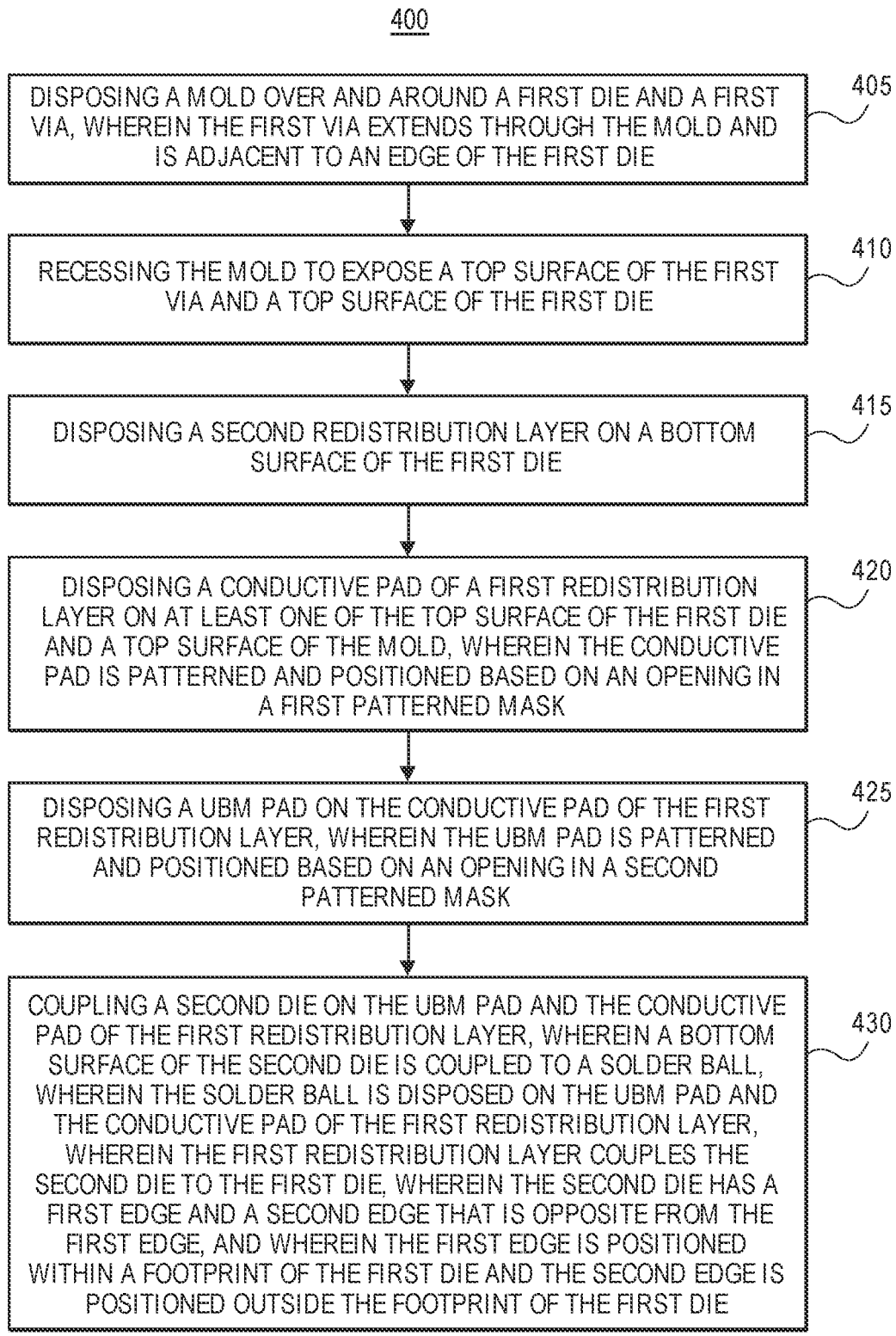
FIG. 4 is a process flow illustrating a method of forming a semiconductor package with a POP implementation that includes a mold layer, a carrier die, a top die, a redistribution layer, and one or more vias, according to one embodiment.

FIG. 4 is a process flow 400 illustrating a method of forming a semiconductor package that includes a mold layer, a carrier die, a top die, a redistribution layer, and one or more vias, according to one embodiment. For one embodiment, the process flow 400 includes one or more steps used to form the POP semiconductor packages as described herein (e.g., the semiconductor packages 100 and 150 of FIGS. 1A-1B, the semiconductor packages 250-252 of FIGS. 2E, and the semiconductor package 350 of FIG. 3).

At block 405, the process flow 400 disposes a mold layer over and around a first die and a first via, where the first via extends through the mold and is adjacent to an edge of the first die (e.g., as shown in FIG. 2A). At block 410, the process flow 400 recesses the mold layer to expose a top surface of the first via and a top surface of the first die (e.g., as shown in FIG. 2B). At block 415, the process flow 400 disposes a second redistribution layer on a bottom surface of the first die (e.g., as shown in FIG. 2B). At block 420, the process flow 400 disposes a conductive pad of a first redistribution layer on at least one of the top surface of the first die and a top surface of the mold layer (i.e., disposing the conductive pad on the first die and/or the mold layer), where the conductive pad is patterned and positioned on the top surface of the first die and/or the mold layer based on an opening in a first patterned mask (e.g., as shown in FIG. 2C).

At block 425, the process flow 400 disposes a UBM pad on the conductive pad of the first redistribution layer, wherein the UBM pad is patterned and positioned on the conductive pad based on an opening in a second patterned mask (e.g., as shown in FIG. 2D). At block 430, the process flow 400 couples (disposes or mechanically attaches) a second die on the UBM pad and the conductive pad of the first redistribution layer, where a bottom surface of the second die is coupled to a solder ball, where the solder ball of the second die is disposed on the UBM pad and the conductive pad of the first redistribution layer, where the first redistribution layer couples the second die to the first die, where the second die has a first edge and a second edge that is opposite from the first edge, and where the first edge is positioned within a footprint of the first die and the second edge is positioned outside the footprint of the first die (e.g., as shown in FIG. 2E).

For additional embodiments, the process flow may include a second via disposed adjacent to the first via, where the second via extends through the mold, where the first redistribution layer includes one or more via conductive pads disposed on at least one of the first via and the second via (e.g., as shown in FIG. 2C), where the second die is coupled to the first via, the second via, and the conductive pad, and where the second redistribution layer includes a second solder ball (e.g., as shown in FIG. 2E). For one embodiment, the process flow may have the footprint of the first die be greater than a footprint of the second die (e.g., as shown in FIG. 1A).

For alternate embodiments, the process flow may have the first redistribution layer disposed only on at least one of the top surface of the first die and the top surface of the mold layer, and the first redistribution layer is not disposed on the first and second vias, as such the second die may be directly coupled to the conductive pad of the first redistribution layer and the exposed surfaces on the first and second vias. For other embodiments, the process flow may include disposing one or more conductive pads of the first redistribution layer on a third via and at least one of the top surface of the first die and the top surface of the mold layer, where the third via is adjacent to a second edge of the first die, and where the second edge is opposite from the edge of the first die (e.g., as shown in FIG. 1A).

For other embodiments, the process flow may include coupling a third top die to the one or more conductive pads of the first redistribution layer, where a bottom surface of the third die is coupled to one or more solder balls, where the solder balls of the third die are disposed on the one or more conductive pads of the first redistribution layer, where the first redistribution layer couples the third die to the first die, where the third die has a first edge and a second edge that is opposite from the first edge, and where the first edge is positioned outside the footprint of the first die and the second edge is positioned within the footprint of the first die (e.g., as shown in FIG. 1A). For other embodiments, the process flow may have one or more top dies disposed on the same conductive pad of the first redistribution layer (e.g., the top dies 105 and 115 disposed on the same conductive pad 170 as shown in FIG. 1B).

Note that the semiconductor package formed by process flow 400 may include fewer or additional packaging components based on the desired packaging design (e.g., as shown in FIGS. 1-3).

Figure 5:
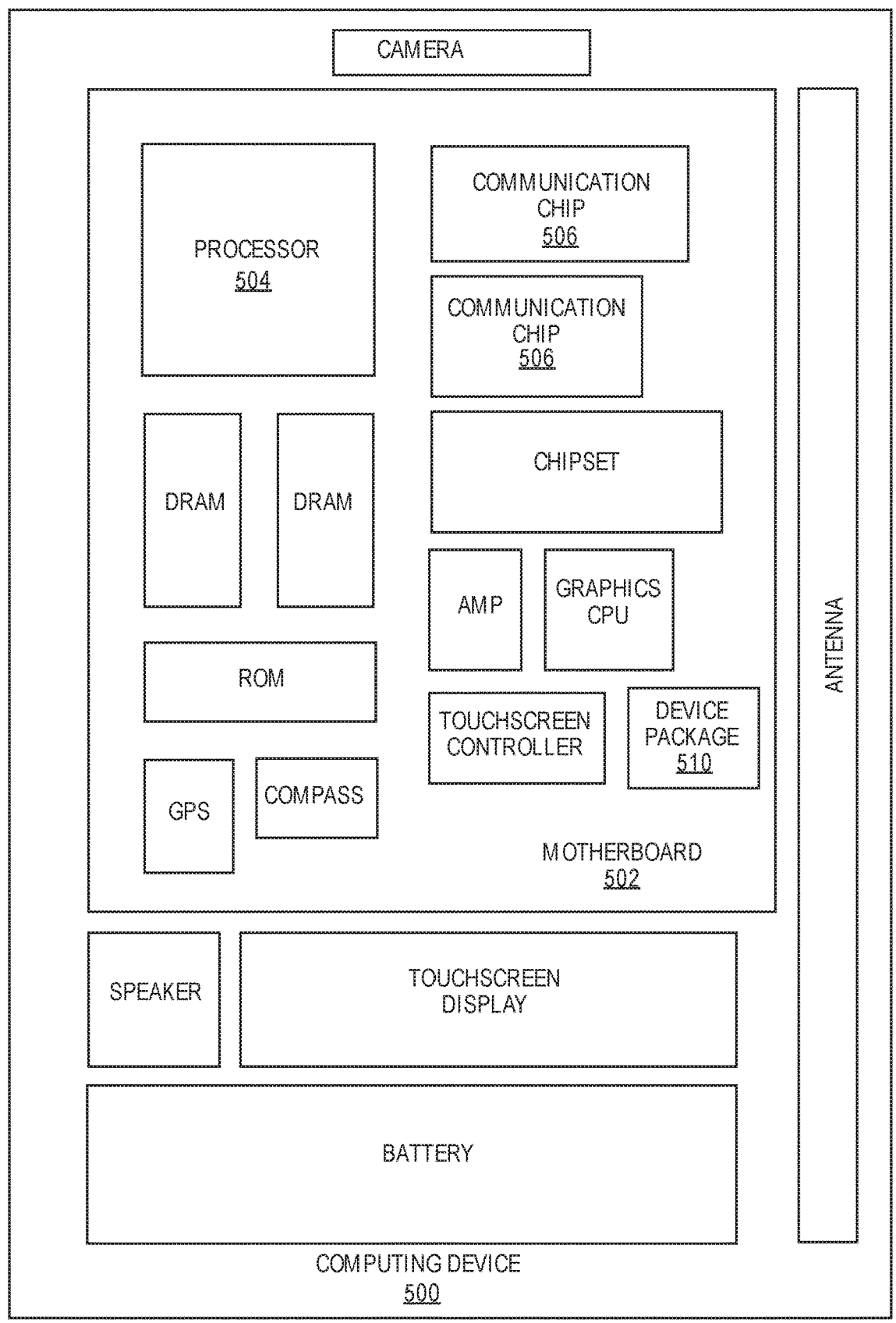
FIG. 5 is a schematic block diagram illustrating a computer system that utilizes a semiconductor/device package with a mold layer, a carrier die, a top die, a redistribution layer, and one or more vias, according to one embodiment.

FIG. 5 is a schematic block diagram illustrating a computer system 500 that utilizes a device package 510 (or a semiconductor package) having a POP packaging that includes a mold layer, a carrier die, a top die(s), a redistribution layer, and one or more vias, according to one embodiment. FIG. 5 illustrates an example of computing device 500. Computing device 500 houses motherboard 502. For one embodiment, motherboard 502 may be similar to the package substrate of FIG. 3 (e.g., the package substrate 302 of FIG. 3). Motherboard 502 may include a number of components, including but not limited to processor 504, device package 510, and at least one communication chip 506. Processor 504 is physically and electrically coupled to motherboard 502. For some embodiments, at least one communication chip 506 is also physically and electrically coupled to motherboard 502. For other embodiments, at least one communication chip 506 is part of processor 504.

Depending on its applications, computing device 500 may include other components that may or may not be physically and electrically coupled to motherboard 502. These other components include, but are not limited to, volatile memory (e.g., DRAM), non-volatile memory (e.g., ROM), flash memory, a graphics processor, a digital signal processor, a crypto processor, a chipset, an antenna, a display, a touchscreen display, a touchscreen controller, a battery, an audio codec, a video codec, a power amplifier, a global positioning system (GPS) device, a compass, an accelerometer, a gyroscope, a speaker, a camera, and a mass storage device (such as hard disk drive, compact disk (CD), digital versatile disk (DVD), and so forth).

At least one communication chip 506 enables wireless communications for the transfer of data to and from computing device 500. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. At least one communication chip 506 may implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. Computing device 500 may include a plurality of communication chips 506. For instance, a first communication chip 506 may be dedicated to shorter range wireless communications such as Wi-Fi and Bluetooth and a second communication chip 506 may be dedicated to longer range wireless communications such as GPS, EDGE, GPRS, CDMA, WiMAX, LTE, Ev-DO, and others.

Processor 504 of computing device 500 includes an integrated circuit die packaged within processor 504. Device package 510 may be, but is not limited to, a packaging substrate and/or a printed circuit board. Device package 510 may be a POP semiconductor package having a mold layer, a carrier die, one or more top dies, a redistribution layer, and one or more vias (as illustrated in FIGS. 1-3)—or any other components from the figures described herein—of the computing device 500. Further, as described herein, the device package 510 may help reduce the processing/assembly steps and the yield risk loss of the computing device 500 by providing a first redistribution layer (e.g., the first redistribution layer 170 of FIG. 1A) on the molded carrier die to reduce the required footprint of the top die—without needing additional steps such as lithograthapy and/or etching.

Note that device package 510 may be a single component/device, a subset of components, and/or an entire system, as the materials, features, and components may be limited to device package 510 and/or any other component of the computing device 500 that may need the first redistribution layer on the molded carrier die for POP packaging (e.g., the motherboard 502 and/or the processor 504 may need a similar POP packaging as described herein).

For certain embodiments, the integrated circuit die may be packaged with one or more devices on a package substrate that includes a thermally stable RFIC and antenna for use with wireless communications and the device package, as described herein, to reduce the z-height of the computing device. The term "processor" may refer to any device or portion of a device that processes electronic data from registers and/or memory to transform that electronic data into other electronic data that may be stored in registers and/or memory.

At least one communication chip 506 also includes an integrated circuit die packaged within the communication chip 506. For some embodiments, the integrated circuit die of the communication chip may be packaged with one or more devices on a package substrate that includes one or more device packages, as described herein.

In the foregoing specification, embodiments have been described with reference to specific exemplary embodiments thereof. It should be borne in mind, however, that all of these and similar terms are to be associated with the appropriate physical quantities and are merely convenient labels applied to these quantities. It will be evident that various modifications may be made thereto without departing from the broader spirit and scope. The specification and drawings are, accordingly, to be regarded in an illustrative sense rather than a restrictive sense.

Although specific embodiments of exemplary apparatuses and methods were described above, one of skill in the art will recognize that in other embodiments many of the above steps may be re-arranged and/or omitted. The foregoing description of specific embodiments reveals the general nature of the disclosure sufficiently that others can, by applying current knowledge, readily modify and/or adapt it for various applications without departing from the generic concept. For example, additional redistribution traces, pads, and/or polymer layers could be used to form additional or multiple layers of one or more materials (e.g., metals) above the semiconductor package (or semiconductor wafer). Therefore, such adaptations and modifications are within the meaning and range of equivalents of the disclosed embodiments.

The following examples pertain to further embodiments. The various features of the different embodiments may be variously combined with some features included and others excluded to suit a variety of different applications.

The following examples pertain to further embodiments:

Example 1 is a semiconductor package, comprising: a mold over and around a first die and a first via. The first via extends through the mold and is adjacent to an edge of the first die; a first redistribution layer on at least one of a top surface of the first die and a top surface of the mold. The first redistribution layer includes a conductive pad; and a second die having a solder ball coupled to a die pad on a bottom surface of the second die. The solder ball of the second die is coupled to the first redistribution layer. The first redistribution layer couples the second die to the first die. The second die has a first edge and a second edge that is opposite from the first edge. The first edge is positioned within a footprint of the first die and the second edge is positioned outside the footprint of the first die.

In example 2, the subject matter of example 1 can optionally include a second redistribution layer on a bottom surface of the first die; the first redistribution layer includes a under metal bump (UBM) pad on the conductive pad. The conductive pad is disposed on at least one of the top surface of the first die and the top surface of the mold; a second via adjacent to the first via. The second via extends through the mold. The first redistribution layer includes one or more via conductive pads disposed on at least one of the first via and the second via; the first solder ball is on the UBM pad. The second die is coupled to the first via, the second via, and the conductive pad; and a second solder ball on the second redistribution layer.

In example 3, the subject matter of any of examples 1-2 can optionally include the footprint of the first die is greater than a footprint of the second die.

In example 4, the subject matter of any of examples 1-3 can optionally include the first redistribution layer is only disposed on at least one of the top surface of the first die and the top surface of the mold, and the first redistribution layer is not disposed on the first and second vias.

In example 5, the subject matter of any of examples 1-4 can optionally include the second die is directly coupled to the conductive pad of the first redistribution layer and exposed surfaces on the first and second vias.

In example 6, the subject matter of any of examples 1-5 can optionally include a third via disposed adjacent to a second edge of the first die. The second edge is opposite from the edge of the first die; the first redistribution layer disposes one or more conductive pads on the third via and at least one of the top surface of the first die and the top surface of the mold; and a third die having solder balls coupled to one or more die pads on a bottom surface of the third die. The solder balls of the third die are coupled to the one or more conductive pads of the first redistribution layer. The first redistribution layer couples the third die to the first die. The third die has a first edge and a second edge that is opposite from the first edge. The first edge is positioned outside the footprint of the first die and the second edge is positioned within the footprint of the first die.

In example 7, the subject matter of any of examples 1-6 can optionally include the conductive pad and via conductive pads include a first material, and the UBM pad includes a second material. The first material is different than the second material.

In example 8, the subject matter of any of examples 1-7 can optionally include the conductive pad of the first redistribution layer has a first diameter, and the UBM pad has a second diameter. The second diameter is equal or less than the first diameter.

In example 9, the subject matter of any of examples 1-8 can optionally include one or more top dies disposed on the same conductive pad of the first redistribution layer.

Example 10 is a method of forming a semiconductor package, comprising: disposing a mold over and around a first die and a first via. The first via extends through the mold and is adjacent to an edge of the first die; recessing the mold to expose a top surface of the first via and a top surface of the first die; disposing a second redistribution layer on a bottom surface of the first die; disposing a conductive pad of a first redistribution layer on at least one of the top surface of the first die and a top surface of the mold. The conductive pad is patterned and positioned based on an opening in a first patterned mask; disposing a UBM pad on the conductive pad of the first redistribution layer. The UBM pad is patterned and positioned based on an opening in a second patterned mask; and coupling a second die on the UBM pad and the conductive pad of the first redistribution layer. A bottom surface of the second die is coupled to a solder ball. The solder ball of the second die is disposed on the UBM pad and the conductive pad of the first redistribution layer. The first redistribution layer couples the second die to the first die. The second die has a first edge and a second edge that is opposite from the first edge. The first edge is positioned within a footprint of the first die and the second edge is positioned outside the footprint of the first die.

In example 11, the subject matter of example 10 can optionally include a second via adjacent to the first via. The second via extends through the mold. The first redistribution layer includes one or more via conductive pads disposed on at least one of the first via and the second via. The second die is coupled to the first via, the second via, and the conductive pad. The second redistribution layer includes a second solder ball.

In example 12, the subject matter of any of examples 10-11 can optionally include the footprint of the first die is greater than a footprint of the second die.

In example 13, the subject matter of any of examples 10-12 can optionally include the first redistribution layer is only disposed on at least one of the top surface of the first die and the top surface of the mold, and the first redistribution layer is not disposed on the first and second vias.

In example 14, the subject matter of any of examples 10-13 can optionally include the second die directly coupled to the conductive pad of the first redistribution layer and exposed surfaces on the first and second vias.

In example 15, the subject matter of any of examples 10-14 can optionally include disposing one or more conductive pads of the first redistribution layer on a third via and at least one of the top surface of the first die and the top surface of the mold. The third via is adjacent to a second edge of the first die. The second edge is opposite from the edge of the first die; and coupling a third die to the one or more conductive pads of the first redistribution layer. A bottom surface of the third die is coupled to one or more solder balls. The solder balls of the third die are disposed on the one or more conductive pads of the first redistribution layer. The first redistribution layer couples the third die to the first die. The third die has a first edge and a second edge that is opposite from the first edge. The first edge is positioned outside the footprint of the first die and the second edge is positioned within the footprint of the first die.

In example 16, the subject matter of any of examples 10-15 can optionally include the conductive pad and via conductive pads include a first material, and the UBM pad includes a second material. The first material is different than the second material.

In example 17, the subject matter of any of examples 10-16 can optionally include the conductive pad of the first redistribution layer has a first diameter, and the UBM pad has a second diameter. The second diameter is equal or less than the first diameter.

In example 18, the subject matter of any of examples 10-17 can optionally include one or more top dies disposed on the same conductive pad of the first redistribution layer.

Example 19 is semiconductor packaged system, comprising: a substrate on a packaged substrate; a die on the substrate; and a package-on-package (POP) on the packages substrate, wherein the POP includes: a mold over and around a first die and a first via. The first via extends through the mold and is adjacent to an edge of the first die; a first redistribution layer on at least one of a top surface of the first die and a top surface of the mold. The first redistribution layer includes a conductive pad; and a second die having a solder ball coupled to a die pad on a bottom surface of the second die. The solder ball of the second die is coupled to the first redistribution layer. The first redistribution layer couples the second die to the first die. The second die has a first edge and a second edge that is opposite from the first edge. The first edge is positioned within a footprint of the first die and the second edge is positioned outside the footprint of the first die.

In example 20, the subject matter of example 19 can optionally include the POP further including: a second redistribution layer on a bottom surface of the first die; the first redistribution layer includes a under metal bump (UBM) pad on the conductive pad. The conductive pad is disposed on at least one of the top surface of the first die and the top surface of the mold; a second via adjacent to the first via. The second via extends through the mold. The first redistribution layer includes one or more via conductive pads disposed on at least one of the first via and the second via; the first solder ball is on the UBM pad. The second die is coupled to the first via, the second via, and the conductive pad; and a second solder ball on the second redistribution layer.

In example 21, the subject matter of any of examples 19-20 can optionally include the footprint of the first die greater than a footprint of the second die. A second POP is disposed on the substrate.

In example 22, the subject matter of any of examples 19-21 can optionally include the first redistribution layer is only disposed on at least one of the top surface of the first die and the top surface of the mold, and the first redistribution layer is not disposed on the first and second vias.

In example 23, the subject matter of any of examples 19-22 can optionally include the second die directly coupled to the conductive pad of the first redistribution layer and exposed surfaces on the first and second vias.

In example 24, the subject matter of any of examples 19-23 can optionally include the POP further including a third via disposed adjacent to a second edge of the first die. The second edge is opposite from the edge of the first die; the first redistribution layer disposes one or more conductive pads on the third via and at least one of the top surface of the first die and the top surface of the mold; and a third die having solder balls coupled to one or more die pads on a bottom surface of the third die. The solder balls of the third die are coupled to the one or more conductive pads of the first redistribution layer. The first redistribution layer couples the third die to the first die. The third die has a first edge and a second edge that is opposite from the first edge. The first edge is positioned outside the footprint of the first die and the second edge is positioned within the footprint of the first die.

In example 25, the subject matter of any of examples 19-24 can optionally include the conductive pad and via conductive pads include a first material, and the UBM pad includes a second material. The first material is different than the second material. The conductive pad of the first redistribution layer has a first diameter, and the UBM pad has a second diameter. The second diameter is equal or less than the first diameter. One or more top dies are disposed on the same conductive pad of the first redistribution layer.

In the foregoing specification, methods and apparatuses have been described with reference to specific exemplary embodiments thereof. It will be evident that various modifications may be made thereto without departing from the broader spirit and scope. The specification and drawings are, accordingly, to be regarded in an illustrative sense rather than a restrictive sense.

What is claimed is:

1. A semiconductor package, comprising:
   a mold around a first die and a first via, wherein the first via extends through the mold and is adjacent to an edge of the first die, and wherein the mold is not vertically overlapping with the first die;
   a first redistribution layer on a top surface of the first die, wherein the first redistribution layer includes a conductive pad;
   a second die having a first solder ball coupled to a die pad on a bottom surface of the second die, wherein the first solder ball of the second die is coupled to the first redistribution layer, wherein the first redistribution layer couples the second die to the first die, wherein the second die has a first edge and a second edge that is opposite from the first edge, and wherein the first edge is positioned within a footprint of the first die and the second edge is positioned outside the footprint of the first die;
   a third die coupled to the first redistribution layer, the third die entirely within the footprint of the first die; and
   a fourth die having a second solder ball coupled to a die pad on a bottom surface of the fourth die, wherein the second solder ball of the fourth die is coupled to the first redistribution layer, wherein the first redistribution layer couples the fourth die to the first die, wherein the fourth die has a first edge and a second edge that is opposite from the first edge, and wherein the first edge is positioned within the footprint of the first die and the second edge is positioned outside the footprint of the first die, and wherein the third die is laterally between the second die and the fourth die.

2. The semiconductor package of claim 1, further comprising:
   a second redistribution layer on a bottom surface of the first die;
   the first redistribution layer includes a under metal bump (UBM) pad on the conductive pad, wherein the conductive pad is disposed on the top surface of the first die;
   a second via adjacent to the first via, wherein the second via extends through the mold, and wherein the first redistribution layer includes one or more via conductive pads disposed on at least one of the first via or the second via;
   the first solder ball is on the UBM pad, wherein the second die is coupled to the first via, the second via, and the conductive pad; and
   a third solder ball on the second redistribution layer.

3. The semiconductor package of claim 1, wherein the footprint of the first die is greater than a footprint of the second die.

4. The semiconductor package of claim 2, wherein the conductive pad and via conductive pads include a first material, and the UBM pad includes a second material, and wherein the first material is different than the second material.

5. The semiconductor package of claim 2, wherein the conductive pad of the first redistribution layer has a first diameter, and the UBM pad has a second diameter, and wherein the second diameter is equal or less than the first diameter.

6. A semiconductor packaged system, comprising:
   a substrate on a package substrate;
   a die on the substrate; and
   a package-on-package (POP) on the package substrate, wherein the POP includes
   a mold around a first die and a first via, wherein the first via extends through the mold and is adjacent to an edge of the first die, and wherein the mold is not vertically overlapping with the first die;
   a first redistribution layer on a top surface of the first die, wherein the first redistribution layer includes a conductive pad;
   a second die having a first solder ball coupled to a die pad on a bottom surface of the second die, wherein the first solder ball of the second die is coupled to the first redistribution layer, wherein the first redistribution layer couples the second die to the first die, wherein the second die has a first edge and a second edge that is opposite from the first edge, and wherein the first edge is positioned within a footprint of the first die and the second edge is positioned outside the footprint of the first die;
   a third die coupled to the first redistribution layer, the third die entirely within the footprint of the first die; and
   a fourth die having a second solder ball coupled to a die pad on a bottom surface of the fourth die, wherein the second solder ball of the fourth die is coupled to the first redistribution layer, wherein the first redistribution layer couples the fourth die to the first die, wherein the fourth die has a first edge and a second edge that is opposite from the first edge, and wherein the first edge is positioned within the footprint of the first die and the second edge is positioned outside the footprint of the first die, and wherein the third die is laterally between the second die and the fourth die.

7. The semiconductor packaged system of claim 6, wherein the POP further includes:
   a second redistribution layer on a bottom surface of the first die;
   the first redistribution layer includes a under metal bump (UBM) pad on the conductive pad, wherein the conductive pad is disposed on the top surface of the first die;
   a second via adjacent to the first via, wherein the second via extends through the mold, and wherein the first redistribution layer includes one or more via conductive pads disposed on at least one of the first via or the second via;
   the first solder ball is on the UBM pad, wherein the second die is coupled to the first via, the second via, and the conductive pad; and
   a third solder ball on the second redistribution layer.

8. The semiconductor packaged system of claim 6, wherein the footprint of the first die is greater than a footprint of the second die, and wherein a second POP is disposed on the package substrate.

9. The semiconductor packaged system of claim 6, wherein the POP further includes:
   a third via disposed adjacent to a second edge of the first die, wherein the second edge is opposite from the edge of the first die; and
   the first redistribution layer comprises a second conductive pad on the third via and a third conductive pad on the top surface of the first die.

* * * * *